United States Patent [19]

Davila et al.

[11] Patent Number: 4,800,335

[45] Date of Patent: Jan. 24, 1989

[54] TEST FIXTURE FOR CIRCUIT COMPONENTS ON CIRCUIT BOARDS

[75] Inventors: Fernando E. Davila, Chicago; Richard G. Schmid, Glenview, both of Ill.

[73] Assignee: Zenith Electronics Corporation, Glenview, Ill.

[21] Appl. No.: 55,471

[22] Filed: May 28, 1987

[51] Int. Cl.4 .............................................. G01R 31/02
[52] U.S. Cl. ............................ 324/158 F; 324/73 PC; 324/537; 340/653
[58] Field of Search ............ 324/158 F, 158 P, 73 PC, 324/537; 356/237; 340/653, 656; 364/550

[56] References Cited

U.S. PATENT DOCUMENTS 4,463,310 7/1984 Whitley ................................ 324/537
4,704,700 11/1987 Linker et al. ..................... 324/73 PC

FOREIGN PATENT DOCUMENTS 0231184 11/1985 Japan ............... 324/158 F

Primary Examiner—Ernest F. Karlsen

[57] ABSTRACT

A test fixture for determining proper or improper insertion of a pair of contact pins from a circuit component through a pair of mating sockets in a circuit board. The fixture includes a support frame mounted beneath and supporting the circuit board. A detection member is movably mounted on the support frame beneath the pair of sockets for engagement by the contact pins upon proper insertion through the sockets. The detection member is movable from a first position whereat neither contact pin is in engagement therewith, to either a second position in response to both contact pins coming into engagement with the detection member or a third position in response to only one contact pin coming into engagement with the detection member. A signal device directs a light beam across the path of movement of the detection member for rendering a signal only when the detection member is in the second position whereat both contact pins are in engagement with the detection member after proper insertion through the sockets in the circuit board to move the detection member to its second position.

18 Claims, 2 Drawing Sheets

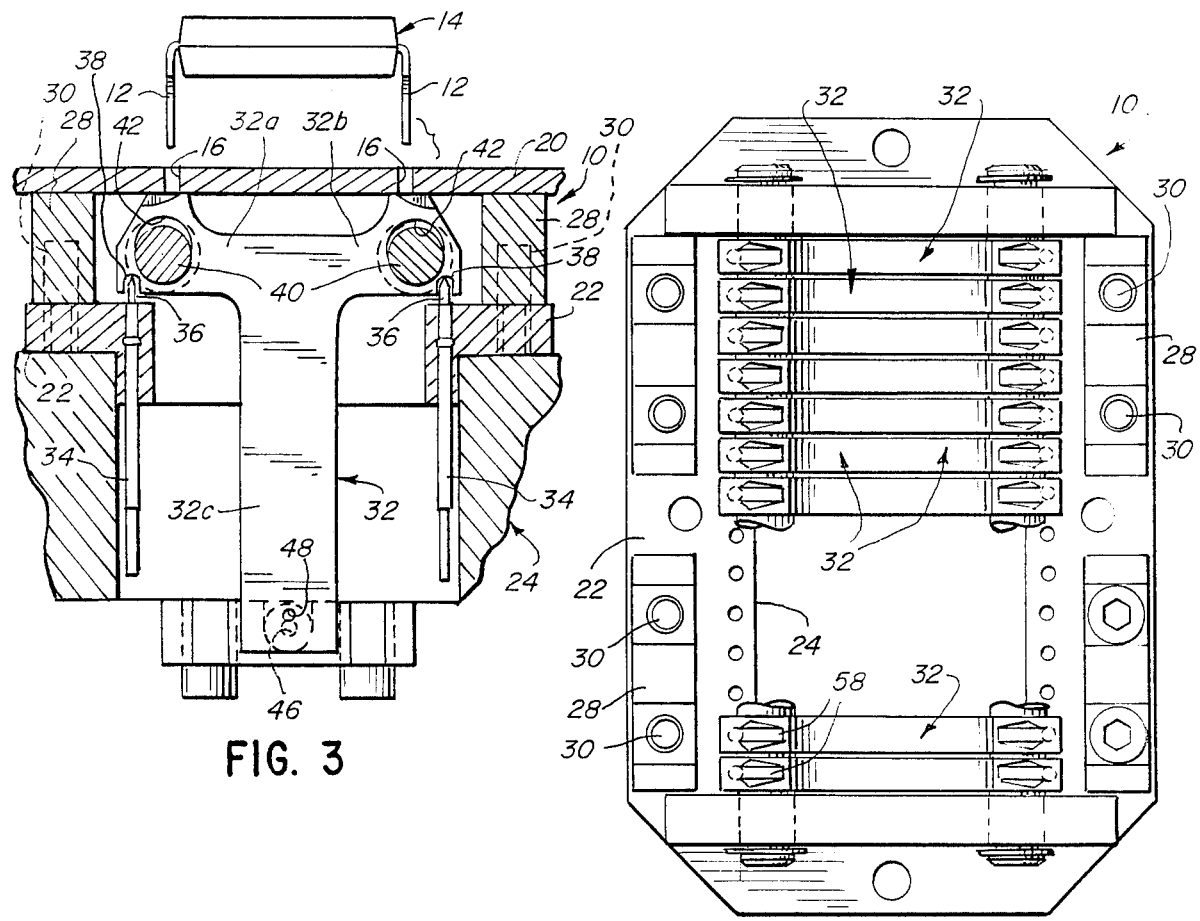
FIG. 3
FIG. 1
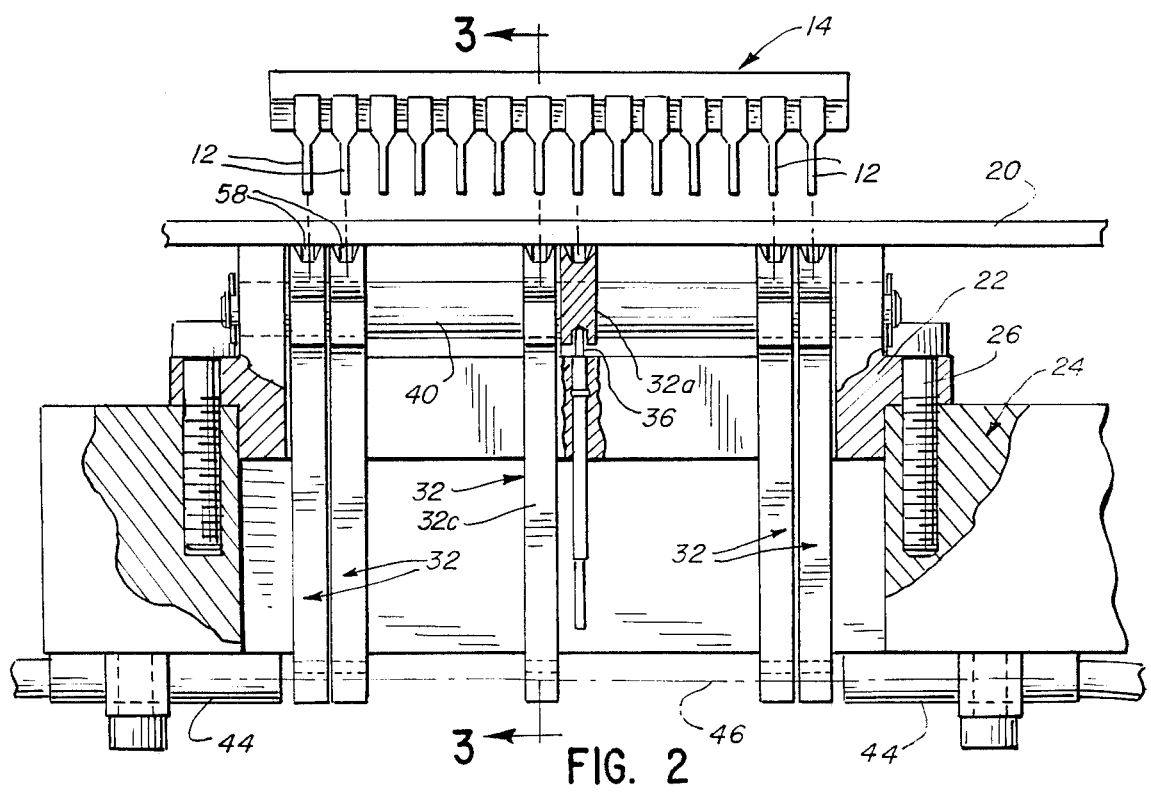
FIG. 2

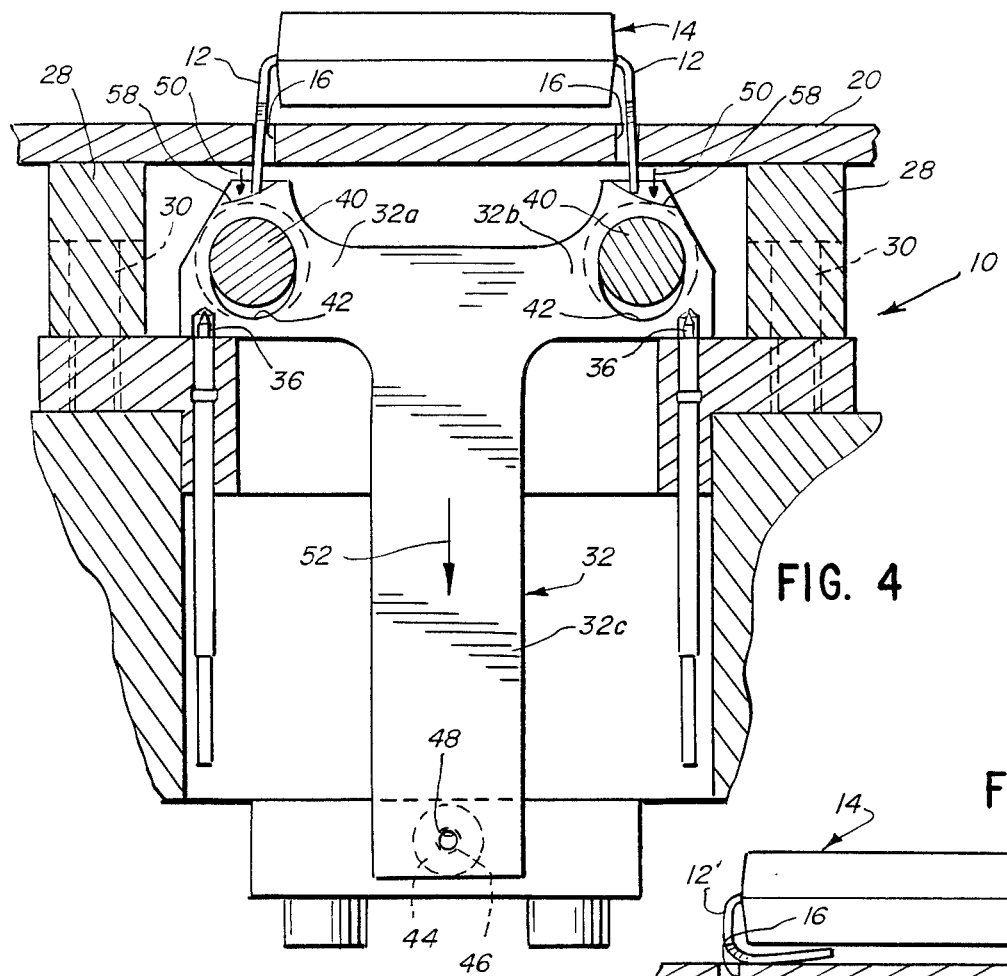
FIG. 4
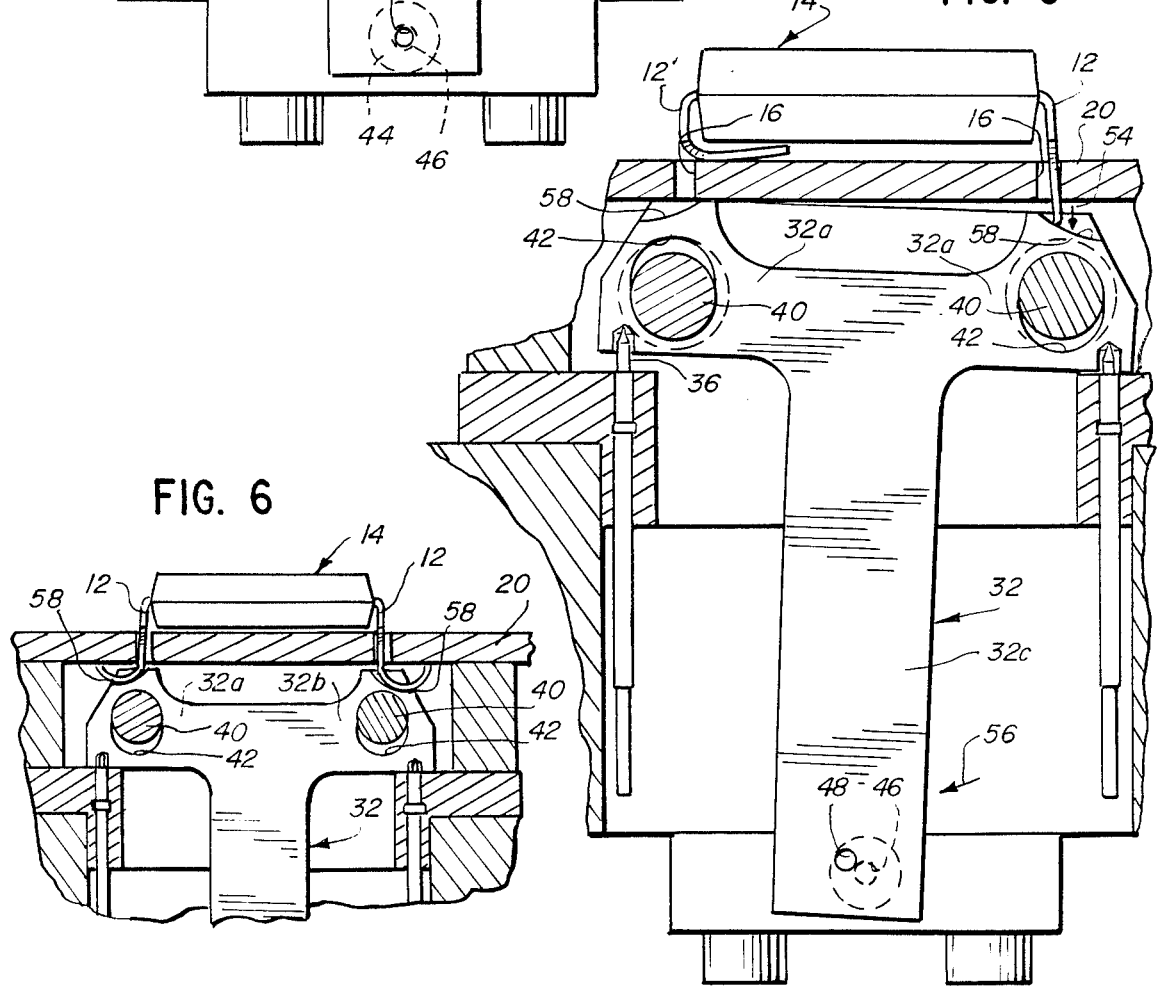
FIG. 5
FIG. 6

TEST FIXTURE FOR CIRCUIT COMPONENTS ON CIRCUIT BOARDS

BACKGROUND OF THE INVENTION

This invention generally relates to a test fixture for determining the integrity of electrical connections between a circuit component or electronic device and a printed circuit board or the like and, particularly, to a test fixture for determining proper or improper insertion of pairs of contact pins from a circuit component through mating pairs of sockets in a printed circuit board.

It is common to electrically connect electronic devices or circuit components to printed circuit boards by means of a plurality of pairs of contact pins, projecting from one side of the electronic device in generally parallel rows, the contact pins being insertable through mating pairs of apertures or sockets arranged in complementary parallel rows through the circuit board. After insertion, the contact pins conventionally are bent against the underside of the circuit board and connected, usually by soldering, to the circuit contacts or leads printed on the board.

Conventionally, the contact pins from the electronic devices are inserted through the sockets in the circuit board at one assembly station. The electrical connections then are made viable by crimping and/or soldering in a subsequent step, often at a second assembly station having proper soldering apparatus. Once the electrical connections have been completed, the entire circuit board is electrically tested to determine electronic integrity. Various causes of failure or lack of electrical integrity may be detected, including the fact that one or more of the contact pins from one or more of the electronic devices, for one reason or another, were not properly positioned through the mating sockets in the circuit board itself.

It would be desirable to determine at an earlier stage in the assembly of the electronic devices to the circuit board whether or not all of the contact pins are properly inserted through the sockets in the circuit board, before proceeding on to the actual electrical terminations and subsequent electrical testing. There is a need for a simple test fixture for determining the mechanics of the system, i.e., proper insertion of the contact pins through the sockets, before proceeding on to the ultimate electronic testing.

This invention is directed to satisfying such a need and eliminating physical defects in the insertion system itself before proceeding to completing the electronic network of the printed circuit board system.

OBJECTS OF THE INVENTION

Accordingly, a principal object of the invention is to provide an improved test fixture for determining proper or improper insertion of contact pins in a printed circuit board.

Another object is to provide a novel test fixture which includes support means mounted beneath the circuit board.

BRIEF DESCRIPTION OF THE DRAWINGS

These and other objects of the invention will be apparent by reading the following description in conjunction with the drawings in which:

FIG. 1 is a top plan view of a test fixture for a single circuit component;

FIG. 2 is a side elevational view of the test fixture of FIG. 1 mounted beneath a circuit board, with a partially cut away portion and with a circuit component about to be inserted through the board;

FIG. 3 is a vertical section taken generally along line 3—3 of FIG. 2;

FIG. 4 is a view similar to that of FIG. 3, on an enlarged scale and illustrating the position of a detection member moved linearly in response to engagement by a pair of contact pins;

FIG. 5 is a view similar to that of FIG. 4, with the detection member moved in a skewed direction in response to engagement by only one contact pin; and FIG. 6 is a fragmented view similar to that of FIGS. 4 and 5, illustrating the contact pins properly inserted and crimped against the underside of the circuit board.

DESCRIPTION OF THE PREFERRED EMBODIMENT

Referring to the drawings in greater detail, and first to FIGS. 1-3, the invention is directed to a test fixture, generally designated 10, for determining proper or improper insertion of pairs of contact pins 12 from a circuit component or electronic device such as a multi-pair contact integrated circuit, generally designated 14, through a pair of mating apertures 16 (FIG. 3) in a printed circuit board 20. It should be understood that one test fixture 10 is provided for each circuit component 14 adapted to be inserted into circuit board 20. In actual practice, it is common to have quite a number of electronic devices or circuit components 14 insertable through a circuit board and electrically connected to the printed contacts or leads (not shown) on the underside of the board. Consequently, a test fixture 10 would be provided beneath circuit board 20 for each circuit component 14 in a complete network for the entire printed circuit board assembly.

Each test fixture 10 includes a generally rectangular, rigid frame or support means 22 surrounding a generally rectangular open area 24 (FIG. 1). The support means is anchored to an overall base by fastening means or bolts 26 (FIG. 2). Spacer blocks 28 (FIGS. 1 and 3) are fixed to the top of rectangular frame 22 by fastening means or screws 30. Printed circuit board 20 rests on top of spacer blocks 28 and any appropriate means can be provided in the entire system for properly locating the circuit board in relation to the subjacent test fixture or fixtures. As described above, plural circuit components 14 are inserted into circuit board 20 at various locations commensurate with apertures 16 in the circuit board and the complementary printed contacts or leads on the underside of the circuit board. Therefore, appropriate means are provided surrounding the circuit board to properly locate the board in relation to the subjacent test fixtures 10.

Each test fixture 10 includes detection means in the form of a plurality of generally T-shaped detection members, generally designated 32. The detection members are mounted in a generally parallel array as shown best in FIG. 1, one such T-shaped detection member being provided for each pair of contact pins 12 of circuit component device 14 as best seen in FIG. 3.

FIG. 3 shows that each T-shaped detection member 32 includes a pair of laterally (horizontally) extending arms 32a and 32b and a vertically depending leg 32c. The arms underlie a pair of sockets 16 in circuit board 20 for engagement by a respective pair of contact pins 12 upon insertion through the sockets. Leg 32c is operatively associated with sensing means, described hereinafter.

Spring means are provided between each arm 32a, 32b of each detection member 32 and support frame 22 for individually biasing each arm, and therefore the entire detection member toward an inoperative, first position as shown in FIG. 3. Specifically, the spring means include a post 34 having a spring loaded pin 36 projecting upwardly into a detent or recess 38 on the underside of the respective arm 32a, 32b of detection member 32. The head of each pin 36 also defines a pivot for detection member 32 for purposes described hereinafter.

All of the T-shaped detection members 32 are mounted in a parallel array (FIG. 1) by means of a pair of generally parallel mounting shafts 40 (FIG. 3) extending lengthwise of support frame 22. The shafts project through enlarged holes 42 through arms 32a, 32b of detection members 32. The enlarged holes provide lost motion mounting means for the detection members whereby the detection members can move against the biasing of spring loaded pins 36 between various positions described hereinafter.

Before proceeding to FIGS. 4-6, it should be understood that the test fixture 10 includes signal means operatively associated with detection members 32, particularly the leg portions 32c thereof, for rendering a signal only when all of the detection members have been properly engaged by the respective pairs of contact pins 12 from electronic device 14. This signal means is in the form of fiber optic means 44 (FIG. 2) for transmitting and receiving a light beam 46 across the path of movement of legs 32c, as seen in FIG. 2. Each leg 32c has an aperture 48 therethrough which can be moved into alignment with light beam 46 only if both contact pins 12 for that particular detection member have been properly inserted through the circuit board into engagement with arms 32a, 32b of the respective detection member. This will be described in greater detail below.

Referring to FIGS. 4-6 in conjunction with FIG. 3, it can be seen that any given detection member 32 has an inoperative, elevated, first position as shown in FIG. 3 before contact pins 12 have been inserted through sockets 16 in circuit board 20. The detection member is biased to such an elevated position by spring loaded pivot pins 36. As seen in FIG. 2, in this inoperative position of any one of the detection members 32, the respective leg portion 32c thereof blocks light beam 46 between fiber optic light means 44 to thereby prevent a signal between a suitable light beam source and receptor (not shown).

FIG. 4 illustrates a T-shaped detection member 32, with the arms 32a, 32b having been properly engaged by a pair of contact pins 12 from circuit component 14. Since the pressure on arms 32a, 32b, as indicated by arrows 50, is equalized, the entire detection member will be moved downwardly in a generally linear direction as indicated by arrow 52, against the spring loaded pins 36. It immediately can be seen that aperture 48 in leg portion 32c of the detection member has been moved into alignment with light beam 46 which is now uninterrupted and gives rise to a signal of "proper" insertion of the respective pairs of contact pins 12. It will be understood that if all detection members 32 in the entire parallel array thereof for test fixture 10 and circuit component 14 have been so properly moved, the light beam or beams 46 traversing the entire array of detection members will be uninterrupted and a signal indicating "proper" insertion, that is, the integrity of the mechanical step of inserting the electronic device will be produced.

FIG. 5 illustrates a condition wherein the left-hand one 12' of the contact pins 12 has, for some reason, been bent and is not inserted through its respective socket 16 in circuit board 20. Even though the right-hand contact pin 12 has been properly inserted through its respective socket 16, no "proper" insertion signal will be produced because light beam 46 is still interrupted. This detection is accomplished by the left-hand spring loaded pin 36 forming a pivot for T-shaped detection member 32, since no pressure is being applied to arm 32a. As contact pin 12 forces arm 32b downwardly in the direction of arrow 54, leg portion 32c moves in a skewed direction as indicated by arrow 56. Leg 32c still interrupts light beam 46 because aperture 48 in the leg portion has been moved generally horizontally rather than downwardly into alignment with the light beam.

It can be seen that unless both contact pins 12 have been properly inserted through sockets 16, leg portion 32c of the T-shaped detection member 32 will not move in a generally linear, downward direction to align aperture 48 with the light beam. This is true regardless of which one of contacts 12 is not, for some reason, inserted through its respective socket 16. Should the right-hand contact pin not be inserted, the left-hand contact pin simply will pivot the leg of the detection member to the right and continue to interrupt the light beam.

Lastly, FIG. 6 shows another feature of the invention wherein the top edges of arms 32a, 32b of detection members 32 are provided with camming grooves 58 for receiving contact pins 12. In essence, the camming grooves define crimping means for bending the contact pins outwardly to underlie circuit board 20 in proper position for subsequent soldering to the contacts or leads printed on the underside of the circuit board.

While a particular embodiment of the invention has been shown and described, it will be apparent to those skilled in the art that modifications thereof may be made without departing from the invention, and the invention is limited only as defined in the appended claims.

What is claimed is:

1. A test fixture for determining proper or improper insertion of a pair of contact pins on a circuit component through a pair of mating sockets in a printed circuit board or the like, comprising:

support means mounted beneath the circuit board;

a single detection member movably mounted on said support means beneath said sockets for engagement by the contact pins upon proper insertion through the sockets, the single detection member being movable from a first position whereat neither contact pin is in engagement therewith to either a second position in response to both contact pins coming into engagement therewith or a third position in response to only one contact pin coming into engagement therewith; and signal means operatively associated with said single detection member for producing a signal only when the detection member is in said second position whereat both contact pins are in engagement therewith after proper insertion through the sockets in the circuit board.

2. The test fixture of claim 1 wherein said detection member is mounted on the support means by means affording movement in a generally linear direction from said first to said second position in response to both contact pins coming into engagement with the detection member.

3. The test fixture of claim 2 wherein said detection member is mounted on the support means for movement in a skewed direction from said first to said third position in response to only one contact pin coming into engagement with the detection member.

4. The test fixture of claim 3 wherein said detection member is spring loaded for biasing toward said first position.

5. The test fixture of claim 1 wherein said signal means comprises means for directing a light beam across the path of movement of said detection member, the light beam being positioned to be broken when the detection member is in either said first or said third position.

6. The test fixture of claim 5, including aperture member through said detection means, the aperture means being in alignment with said light beam only when the detection member is in said second position.

7. The test fixture of claim 1 wherein said detection member includes crimping means for bending the contact pins toward the underside of the circuit board upon proper insertion through said sockets.

8. A test fixture for determining proper or improper insertion of a pair of contact pins on a circuit component through a pair of mating sockets in a printed circuit board or the like, comprising:
support means mounted beneath the circuit board;
detection means movably mounted on said support means beneath said sockets for engagement by the contact pins upon proper insertion through the sockets, the detection means being movable from a first position whereat neither contact pin is in engagement therewith to either a second position in response to both contact pins coming into engagement therewith or a third position in response to only one contact pin coming into engagement therewith, said detection means including a pair of laterally extending arms and a depending leg with said arms underlying said sockets for engagement by the contact pins upon insertion through the sockets; and
signal means operatively associated with the leg of said detection means for producing a signal only when the detection means is in said second position whereat both contact pins are in engagement therewith after proper insertion through the sockets in the circuit board.

9. The test fixture of claim 8, including spring means between each arm of the detection means and said support means for individually biasing each arm and, therefore, the detection means toward said first position, whereby the leg is movable in a generally linear direction to said second position in response to both contact pins coming into engagement with said arms.

10. The test fixture of claim 9 wherein said spring means include a spring loaded post receivable in a detent on the underside of each of said arms, each spring loaded post forming a pivot for the detection means, whereby said leg moves in a skewed direction to said third position in response to only one contact pin coming into engagement with the detection means.

11. The test fixture of claim 10 wherein said signal means comprise means for directing a light beam across the path of movement of said leg, the light beam being positioned to be broken when the leg is in either said first position or said third, skewed position.

12. The test fixture of claim 11, including aperture means through said leg, the aperture means being in alignment with said light beam only when the leg is in said second position.

13. The test fixture of claim 8 wherein each arm has crimping means for bending the respective contact pin toward the underside of the circuit board upon proper insertion through the respective socket.

14. The test fixture of claim 1, including a plurality of said detection member mounted on said support means, each detection member being engageable by a pair of contact pins from a multi-pair contact circuit component.

15. A test fixture for determining proper or improper insertion of a pair of contact pins from a circuit component through a pair of mating sockets in a printed circuit board or the like, comprising:
support means mounted beneath the circuit board;
a generally T-shaped detection member movably mounted on said support means and including a pair of laterally extending arms and a depending leg, the arms being located under the respective sockets for engagement by the contact pins upon insertion through the sockets, and the leg having an aperture therethrough;
a spring loaded post mounted on the support means and engageable with the underside of each of said arms for individually biasing each arm and, therefore, the detection member toward an inoperative position, each post forming a pivot for the detection member, whereby the detection member is movable from said inoperative position whereat neither contact pin is in engagement with the arms of the detection member to either a second position in response to both contact pins coming into engagement with the arms of the detection member and depressing the detection member in a generally linear direction against the biasing of said spring loaded posts or a third position in response to only one contact pin coming into engagement with a respective arm of the detection member whereupon the detection member moves about the opposite spring loaded post to move the leg in a skewed direction; and
signal means for directing a light beam across the path of movement of said leg for rendering a signal, only when the detection member is engaged by both contact pins after proper insertion through the sockets in the circuit board to move the aperture in the leg into alignment with the light beam, indicating proper insertion of the circuit component.

16. The test fixture of claim 15 wherein each arm has crimping means for bending the respective contact pin toward the underside of the circuit board upon proper insertion through the respective socket.

17. The test fixture of claim 16 wherein said crimping means are defined by camming grooves formed in the upper surfaces of said arms for engaging and bending the contact pins.

18. The test fixture of claim 15, including a plurality of said detection members mounted on said support means, each detection member being engageable by a pair of contact pins from a multi-pair contact circuit component.

* * * * *